US008693201B2

(12) United States Patent
Yamazaki

(10) Patent No.: US 8,693,201 B2
(45) Date of Patent: Apr. 8, 2014

(54) SWITCH STRUCTURE, ELECTRONIC COMPONENT PART INSTALLING STRUCTURE, AND ELECTRONIC MUSICAL INSTRUMENT INCLUDING THE SAME

(75) Inventor: Kenji Yamazaki, Iwata (JP)

(73) Assignee: Yamaha Corporation (JP)

( * ) Notice: Subject to any disclaimer, the term of this patent is extended or adjusted under 35 U.S.C. 154(b) by 222 days.

(21) Appl. No.: 13/325,694

(22) Filed: Dec. 14, 2011

(65) Prior Publication Data

US 2012/0147570 A1 Jun. 14, 2012

(30) Foreign Application Priority Data

Dec. 14, 2010 (JP) ................................. 2010-278688

(51) Int. Cl.

| | |
|---|---|
| ***H05K 1/00*** | (2006.01) |
| ***H05K 1/18*** | (2006.01) |
| ***H05K 7/00*** | (2006.01) |
| ***H01H 3/12*** | (2006.01) |
| ***H01H 13/14*** | (2006.01) |
| ***H01H 9/00*** | (2006.01) |
| ***H01H 13/72*** | (2006.01) |
| ***H01H 13/76*** | (2006.01) |

(52) U.S. Cl.
USPC ............. 361/748; 200/341; 200/5 D; 200/5 E

(58) Field of Classification Search
None
See application file for complete search history.

(56) References Cited

U.S. PATENT DOCUMENTS 3,673,357 A * 6/1972 Molchan ........................ 200/5 A
4,242,546 A * 12/1980 Alonso ........................ 200/16 A
4,366,355 A * 12/1982 Oelsch .......................... 200/517
4,439,646 A * 3/1984 Bouvrande .................... 200/5 A
4,638,131 A * 1/1987 Kidd et al. ................. 200/61.55
4,638,133 A * 1/1987 Dvorak et al. ............. 200/302.1
4,692,571 A * 9/1987 Trinh et al. .................... 200/5 A
4,719,322 A * 1/1988 Guzik et al. .................. 200/5 A
5,521,342 A * 5/1996 Bartley et al. ................. 200/5 A
5,887,704 A * 3/1999 Schorpp et al. ............... 200/296
5,950,810 A * 9/1999 Pan et al. ....................... 200/344
5,952,731 A * 9/1999 McPherson et al. ......... 307/10.2
6,080,940 A * 6/2000 Rice .............................. 200/5 A
6,133,536 A * 10/2000 Hunag et al. .................. 200/5 A
6,140,593 A * 10/2000 Bramesfeld et al. .......... 200/5 A
6,169,256 B1 * 1/2001 Hanahara et al. ............. 200/5 A (Continued)

FOREIGN PATENT DOCUMENTS

JP 2650179 B2 9/1997
JP 11039994 A 2/1999

*Primary Examiner* — Jinhee J Lee
*Assistant Examiner* — Xanthia C Cunningham
(74) *Attorney, Agent, or Firm* — Rossi, Kimms & McDowell LLP

(57) ABSTRACT

An intermediate member includes: a base section including a fixing portion provided on a circuit board along the outer periphery of a switch section, and a cylindrical held portion formed integrally with the upper end of the fixing portion; a operator portion operable to drive the switch section; and a resilient connection portion resiliently connecting the operator portion to the base section. A panel member and the circuit board are fixed in face-to-face pressed engagement with each other with the intermediate member sandwiched therebetween. The operator portion is partly exposed out of an opening portion formed in the panel member, the held portion is held fitted with a cylindrical holding portion provided on the lower surface of the panel member, and the fixing portion is sandwiched between the lower end of the holding portion and the upper surface of the circuit board.

15 Claims, 10 Drawing Sheets

A-A

(56) References Cited

U.S. PATENT DOCUMENTS

| | | | | |
|---|---|---|---|---|
| 6,359,242 | B1 * | 3/2002 | Maple | 200/5 A |
| 6,365,848 | B1 * | 4/2002 | Maple | 200/5 A |
| 6,552,282 | B2 * | 4/2003 | Lewis | 200/5 A |
| 6,555,774 | B1 * | 4/2003 | Nielsen | 200/343 |
| 6,658,868 | B2 * | 12/2003 | Raab et al. | 62/126 |
| 6,964,532 | B1 * | 11/2005 | Lu | 400/490 |
| 7,084,360 | B2 * | 8/2006 | Schmidt et al. | 200/5 R |
| 7,115,827 | B2 * | 10/2006 | Tseng | 200/341 |
| 7,265,309 | B2 * | 9/2007 | Kim et al. | 200/341 |
| 7,321,101 | B2 * | 1/2008 | Hirobe et al. | 200/5 R |
| 7,394,038 | B2 * | 7/2008 | Chang | 200/341 |
| 7,488,911 | B2 * | 2/2009 | Tsai | 200/330 |
| 7,498,537 | B1 * | 3/2009 | Duwel | 200/517 |
| 7,507,918 | B2 * | 3/2009 | Kazama | 200/6 A |
| 7,523,679 | B2 * | 4/2009 | Hawes et al. | 73/862.381 |
| 7,554,047 | B2 * | 6/2009 | Verdu et al. | 200/314 |
| 7,601,925 | B1 * | 10/2009 | Li et al. | 200/293 |
| 7,712,678 | B2 * | 5/2010 | Mizukoshi | 236/94 |
| 7,989,715 | B2 * | 8/2011 | Saito | 200/5 R |
| 2004/0079623 | A1 * | 4/2004 | Kataoka et al. | 200/19.03 |
| 2004/0140190 | A1 * | 7/2004 | Searle et al. | 200/341 |
| 2004/0182687 | A1 * | 9/2004 | Tsubaki | 200/341 |
| 2005/0077157 | A1 * | 4/2005 | Sasanouchi et al. | 200/38 A |
| 2005/0133347 | A1 * | 6/2005 | Hein | 200/5 R |
| 2006/0021363 | A1 * | 2/2006 | Mizukoshi | 62/129 |
| 2006/0283691 | A1 * | 12/2006 | Chang et al. | 200/5 A |
| 2007/0074959 | A1 * | 4/2007 | Ikeda | 200/5 R |
| 2007/0227864 | A1 * | 10/2007 | Tsai | 200/293 |
| 2008/0237023 | A1 * | 10/2008 | Kazama | 200/6 A |
| 2009/0205942 | A1 * | 8/2009 | Sakai et al. | 200/341 |
| 2009/0236206 | A1 * | 9/2009 | Wennemer et al. | 200/302.2 |
| 2009/0277763 | A1 * | 11/2009 | Kyowski et al. | 200/314 |

* cited by examiner

C-C

A-A

I-I

SWITCH STRUCTURE, ELECTRONIC COMPONENT PART INSTALLING STRUCTURE, AND ELECTRONIC MUSICAL INSTRUMENT INCLUDING THE SAME

BACKGROUND

The present invention relates to switch structures and electronic/electric component part installing structures suited for application to various electronic equipment, such as electronic musical instruments, and electronic musical instruments including such switch structures or electronic/electric component part installing structures.

The various conventionally-known electronic equipment, such as electronic keyboard musical instruments, includes various operating switches provided on an operation panel. Among examples of such switches are switch structures disclosed in Japanese Patent Application Laid-open Publication No. HEI-11-39994 (hereinafter referred to as "patent literature 1") and Japanese Patent No. 2650179 (hereinafter referred to as "patent literature 2"). The switch structure disclosed in patent literature 1 includes a plate-shaped operation panel having holes through which controls (or operators) are partly exposed out of the holes, a circuit board disposed under the operation panel, fixed contacts provided on the circuit board, the controls each vertically movably mounted to the underside of the operation panel via a flexible hinge portion, actuators each having a projecting shape and provided on the underside of a corresponding one of the controls; contact rubber members each provided on the circuit board and formed of resilient resin for being depressed by a corresponding one of the actuators; and movable contacts each provided on the underside of a corresponding one of the contact rubber members. The operation panel having the controls mounted to its underside and the circuit board having the contact rubber members on its topside are fixed in spaced apart relation to each other via spacers. As any one of the controls projecting out of the holes is depressed by a user's finger or the like, the contact rubber member corresponding to the depressed control is depressed and resiliently deformed by the actuator of the control. Thus, the movable contact of the contact rubber member contacts a corresponding one of the fixed contacts on the circuit board, so that a corresponding switch is turned on.

In the switch structure disclosed in patent literature 1, the actuator of each of the controls is disposed over the corresponding contact rubber member provided on the circuit board, and the contact rubber member is constantly slightly pressed by the control against the circuit board. Because the control is vertically movably provided via the flexible hinge portion, the contact rubber member and the control is slightly movable relative to the circuit board and operation panel rather than being completely fixed to the circuit board and operation panel. However, in a case where the switch structure disclosed in patent literature 1 is provided in an electronic keyboard instrument that audibly generates sounds through a speaker or the like, a casing of the electronic keyboard instrument would slightly vibrate depending on sounds generated. In such a case, vibrating sound (so-called RUB & BUZZ) may undesirably occur in the controls and contact rubber members due to the slight vibration propagating from the casing to the circuit board and operation panel. As one approach for reducing the vibrating sound, it may be conceivable to apply pretension to the hinge portions so that the contact rubber members are mounted on the circuit board in a slightly pressed state. With such an approach, however, deformation may undesirably occur in the contact rubber members, preventing appropriate ON/OFF operation of the contacts.

Further, the switch structure disclosed in patent literature 1, the controls partly exposed out of the holes and the contact rubber members to be pressed by the controls are constructed as separate parts, which would thus result in a great number of necessary component parts of the switch structure and prevent simplification of the switch structure. In addition, the great number of component parts would require much time and labor in assembly work and can prevent simplification of manufacturing steps of the switch structure.

Further, the switch structure disclosed in patent literature 2 is a key switch structure of an electronic keyboard instrument which includes: a keyboard having a plurality of keys, actuators each having a projecting shape and provided on the underside of a corresponding one of the keys; and a contact rubber member formed of a resilient material, such as rubber, and disposed between the actuators and a circuit board having fixed contacts disposed under the keyboard. The contact rubber member includes a plate-shaped base section provided on the circuit board, upwardly-convexed cup portions provided on the base section and spaced from each other at predetermined intervals, and movable contacts each provided on the underside (inner bottom surface) of a corresponding one of the cup portions. Further, small mounting projections are provided on the base section of the contact rubber member and fixedly inserted in corresponding small fixing holes formed in the circuit board.

In the switch structure disclosed in patent literature 2, the contact rubber member is fixedly mounted on the circuit board by means of the small mounting projections, and the contact rubber member is pressed against the circuit board via the actuator of the key abutted against the upper surface of the cup portion. Thus, even if the casing of the electronic keyboard instrument slightly vibrates due to sound audibly generated through a speaker and propagates form the casing to the circuit board and operation panel, it is possible to suppress, to some degree, vibrating sound occurring in the contact rubber member. However, with the switch structure disclosed in patent literature 2, where the entire base section including portions located between the adjoining cup portions is disposed in face contact with the upper surface of the circuit board, vibrating sound (Rub & Buzz) can occur between the base section and the circuit board due to the slight vibration.

Further, with the switch structure disclosed in patent literature 2, the small mounting projections, provided on the contact rubber member as a structure for fixing the rubber member, can suppress, to some degree, vibrating sound of the contact rubber member. However, because the contact rubber member includes a rubber sheet of a thin plate shape having not only a multiplicity of contacts integrally formed thereon but also the above-mentioned small mounting projections formed thereon at predetermined intervals, the contact rubber member would undesirably become complex in shape. Besides, because operation for fixedly inserting the small mounting projections into the small holes of the circuit board, much time and labor would be required for assembling the switch structure.

SUMMARY OF THE INVENTION

In view of the foregoing prior art problems, it is an object of the present invention to provide an improved switch structure and electronic/electric component part installing structure which, with a simple construction requiring only a minimized number of necessary component parts, can effectively suppress vibrating sound caused due to slight vibration of the component parts, as well as an electronic musical instrument including such a switch structure or electronic/electric component part installing structure.

In order to accomplish the above-mentioned object, the present invention provides an improved switch structure (10), which comprises: a circuit board (60) including a switch section (62) where at least a part of component parts (61*a*, 61*b*) constituting a switch contact (61) is provided; an intermediate member (40) including: a base section (45) provided in a corresponding relation to the switch section (62) on said circuit board (60) and including a held portion (43); a operator portion (47) operable to drive said switch section (62); and a resilient connection portion (49) resiliently connecting the operator portion (47) to said base section (45); a panel member (20) including a plate-shaped body portion (21), an opening portion (23) formed in the body portion (21) for positioning therein the operator portion (47), and a cylindrical holding portion (25) provided on the lower surface (20*b*) of the body portion (21) around the opening portion (23) and projecting toward the circuit board (60); and a fixing member (70) which fixes together the panel member (20) and the circuit board (60) in face-to-face pressed engagement with the intermediate member (40) sandwiched between the panel member (20) and the circuit board (60). The operator portion (47) of the intermediate member (40) is partly exposed out of the opening portion (23) of the panel member (20), the held portion (43) of the intermediate member (40) is held fitted in the holding portion (25) of the panel member (20). Note that the terms "upper", "lower", "upper surface", "lower surface", etc. are used herein to refer to directions as viewed when the panel member, intermediate member and circuit board are disposed in a horizontal orientation and in vertically superposed relation to one another.

According to the switch structure of the present invention, the intermediate member can be reliably fixed relative to the panel member and circuit board because the held portion of the intermediate member is held fitted in the holding portion of the panel member. With such arrangements, the present invention can effectively suppress or prevent generation of vibrating sound (Rub & Buzz) between the intermediate member and the panel member and circuit board even in a situation where slight vibration transmits to the panel member and circuit board.

Further, with the held portion of the intermediate member fittedly held by the holding portion of the panel member, the operator portion inserted in the opening portion of the panel member can also be positioned appropriately. Thus, the present invention can achieve an enhanced design of the operation panel section etc. Further, because the intermediate member includes the operator portion having both a function as a control (operator) for being depressed by a user and a function as a driver for driving the switch section, the present invention can reduce or minimize the number of necessary component parts and simplify necessary steps for assembling the switch structure, as compared to the conventionally-known counterparts.

Preferably, in the switch structure of the present invention, the base section (45) may further include a fixed portion (41) at a lower end of the held portion (43) so that the held portion (43) is formed integrally with an upper end of the fixing portion (41), the fixed portion (41) having a lateral size larger than the held portion (43) to form a step at the upper end of the fixing portion (41), and the step of the fixing portion (41) is sandwiched between a lower end of the holding portion (25) of said panel member (20) and an upper surface of said circuit board (60). In this way, where the fixing portion of the intermediate member is sandwiched between the lower end of the holding portion of the panel member and the upper surface of the circuit board, the intermediate member can be even more reliably fixed relative to the panel member and circuit board. Further, with the fixing portion of the intermediate member sandwiched between the lower end of the holding portion of the panel member and the upper surface of the circuit board, there is no need for any separate member for fixing the intermediate member to the circuit board. In this way, it is possible to not only simplify the shape of the intermediate member but also facilitate assembling of the switch structure.

Preferably, in the switch structure of the present invention, the held portion (43) of the base section (45) of the intermediate member (40) has a cylindrical outer shape, and the fixed portion (41) has a diameter larger than the held portion (43) to form a circular step at the upper end of the fixing portion (41) as said step. Further, preferably, in the switch structure of the present invention, the base section (45) is provided in a positional corresponding relation to an outer periphery of the switch section (62) on said circuit board (60).

Preferably, in the switch structure of the present invention, the circuit board (60) includes a plurality of the switch sections (62) disposed at a predetermined interval, the intermediate member (40) including a plurality of the base sections (45) and a plurality of the operator portions (47) corresponding to individual ones of the plurality of the switch sections (62), the panel member (20) having a plurality of the opening portions (23) corresponding to individual ones of the plurality of the operator portions (47). Further, the intermediate member (40) further includes a connecting portion (51) interconnecting the base sections (45) disposed along the respective outer peripheries of adjoining ones of the operator portions (47), the connecting portion (51) being formed in such a manner that a gap (A) is defined between the connecting portion (51) and the upper surface (60*a*) of the circuit board (60). Because the connecting portion interconnecting the fixing portions corresponding to the plurality of the switch sections is disposed out of contact with, or spaced from, the circuit board, it is possible to prevent generation of vibrating sound in the gap between the connecting portion and the circuit board. In this way, the present invention can effectively prevent generation of vibrating sound between a plurality of switches that has been a problem with the conventionally-known counterparts.

Further, preferably, in the switch structure of the present invention, the component parts constituting the switch contact (61) include a fixed contact (61*a*) provided in the switch section (62) of the circuit board (60) and a movable contact (61*b*) provided on the lower surface (47*b*) of the operator portion (47). In response to depressing operation on the operator portion (47), switching is effected by the movable contact (61*b*) being brought into contact with the fixed contact (61*a*). Alternatively, the component parts constituting the switch contact (61) may include a push button switch (61*c*) provided in the switch section (62) and activatable by being pressed by a user. In response to depressing operation on the operator portion (47), switching is effected by the lower surface (47*b*) of the operator portion (47) depressing the push button switch (47).

Further, preferably, in the switch structure of the present invention, the intermediate member (40) includes a surrounding portion (52) in the form of a cylindrical projection provided along the outer periphery of the held portion (43) and surrounding the outer periphery of the holding portion (25) of the panel member (20), and a recess portion (54) provided between the held portion (43) and the surrounding portion (52) for insertion therein of the lower end (52*b*) of the holding portion (25), and the lower end (25*b*) of the holding portion (25) is disposed in the recess portion (54), with the held portion (43) held fitted on the holding portion (25), so that the surrounding portion (52) overlaps the outer periphery of the holding portion (25). Because the lower end of the holding portion is disposed in the recess portion, with the held portion held fitted on the holding portion, so that the surrounding portion overlaps the outer periphery of the holding portion, the surrounding portion can seal up between the lower end of the holding portion and the fixing portion of the intermediate member. Thus, even when liquid has passed through the opening portion toward the circuit board, it is possible to prevent the liquid from entering the switch portion of the circuit board. In this way, the present invention can perform a waterproof function. Also, the present invention can prevent foreign substances, such as dust, from entering the switch portion from the upper surface side of the panel member.

Further, preferably, in the switch structure of the present invention, at least a part of the operator portion (47-2) is formed as a transparent portion (47-2) that is transparent or semitransparent. The switch structure of the present invention further includes a light emitting element (L) provided on the circuit board (60) in the switch section (62) in such a manner that emitted light of the light emitting element (L) passes through the transparent portion (47-2) so as to be radiated to the upper surface (47-2*a*) of the operator portion (47-2). With such arrangements, the present invention allows the switch structure to perform a light emitting function, by just mounting the light emitting element on the circuit board. As a result, the present invention can achieve an enhanced convenience of the switch structure with a simple construction.

According to another aspect of the present invention, there is provided an electronic/electric component part installing structure, which comprises: a circuit board (60) including a plurality of electronic component part installing sections (62, 62-2) in each of which an electronic/electric component part (61, L) is provided; an intermediate member (40) including: a plurality of base sections (45) each provided in a corresponding relation to any one of the electronic component part installing sections (62, 62-2) on said circuit board (60), each of the base sections (45) including a held portion (43); a plurality of operator portions (47, 47-2) each provided over a corresponding one of the electronic component part installing sections (62, 62-2); and a plurality of connection portions (49) each connecting a corresponding one of the operator portions (47, 47-2) to a corresponding one of the base sections (45); a panel member (20) including a plate-shaped body portion (21), a plurality of opening portions (23) each formed in the body portion (21) in a corresponding relation to any one of the operator portions (47, 47-2) for positioning therein the corresponding operator portion (47, 47-2), and a plurality of holding portions (25) each provided on a lower surface of the body portion around a corresponding one of the opening portions (23) and projecting toward said circuit board (60); and a fixing member (70) which fixes together the panel member (20) and the circuit board (60) in face-to-face pressed engagement with the intermediate member (40) sandwiched between the panel member (20) and the circuit board (60). Each of the operator portion (47, 47-2) of the intermediate member (40) is partly exposed out of the corresponding opening portion (23), and the held portion (43) of the intermediate member (40) is held fitted with the corresponding holding portion (25) of the panel member (20). The intermediate member (40) further includes one or more connecting portion (51) each interconnecting a corresponding one of the base sections (45) and another base section (45) adjoining the corresponding base section (45), each of the connecting portions (51) being provided in such a manner that a gap (A) is defined between the connecting portion (51) and an upper surface (60*a*) of the circuit board (60).

According to the electronic/electric component part installing structure of the present invention, the intermediate member can be reliably fixed relative to the panel member and circuit board because the held portion of the intermediate member is held fitted in the holding portion of the panel member. With such arrangements, the present invention can effectively suppress or prevent generation of vibrating sound (Rub & Buzz) between the intermediate member and the panel member and circuit board even in a situation where slight vibration transmits to the panel member and circuit board.

Further, because the connecting portion connecting the base section to another base section adjoining the base section is disposed out of contact with, or spaced from, the circuit board, it is possible to prevent generation of vibrating sound in the gap between the connecting portion and the circuit board. In this way, the present invention can effectively prevent generation of vibrating sound in the connecting portion between the adjoining base sections that has been a problem with the conventionally-known counterparts. Further, because the connecting portion is spaced from the upper surface of the circuit board, assembling of the intermediate member can be facilitated when the intermediate member, including the connecting portion connecting the base section of the electronic/electric component part installing structure to the adjoining other base section is to be assembled with the intermediate member sandwiched between the panel member and the circuit board.

Preferably, in the electronic/electric component part installing structure of the present invention, each of the base sections (45) further includes a fixed portion (41) at a lower end of the held portion (43) so that the held portion (43) is formed integrally with an upper end of the fixing portion (41), the fixed portion (41) having a lateral size diameter larger than the held portion (43) to form a circular step at the upper end of the fixing portion (41), and the circular step of the fixing portion (41) is sandwiched between a lower end of the corresponding holding portion (25) of said panel member (20) and the upper surface of said circuit board (60). In this way, the fixing portion of the intermediate member is sandwiched between the lower end of the holding portion of the panel member and the upper surface of the circuit board, the intermediate member can be even more reliably fixed relative to the panel member and circuit board.

Preferably, in the electronic/electric component part installing structure of the present invention, the held portion (43) of each of the base sections (45) of the intermediate member (40) has a cylindrical outer shape, and the fixed portion (41) has a diameter larger than the held portion (43) to form a circular step at the upper end of the fixing portion (41) as said step. Further, preferably, in the electronic component part installing structure of the present invention, each of the base sections (45) is provided in a positional corresponding relation to an outer periphery of the corresponding electronic component part installing section (62, 62-2) on said circuit board (60).

Preferably, in the switch structure or the electronic/electric component part installing structure according to the present invention, the fixing member (70) comprises: a plurality of bosses (27) provided on the lower surface (20*b*) of the body portion (21) of the panel member (20) and projecting toward the upper surface (60*a*) of the circuit board (60), a number of the bosses (27) being less than a number of the operator portions (47, 47-2); a plurality of screw holes (28) each formed in a distal end portion of any one of the bosses (27); and a plurality of screws (70) each adapted to be screwed into any one of the screw holes (28) of the bosses (27). The screws (70) are screwed into the screw holes (28) of the bosses (27) from a lower surface of circuit board (60) to fix together said panel member (20) and said circuit board (60) in face-to-face pressed engagement with said intermediate member (40) sandwiched between said panel member (20) and said circuit board (60).

According to still another aspect of the present invention, there is provided an electronic musical instrument, which comprises: an operation panel section (1) where are arranged operator portions operable to perform setting operation of various functions; and a speaker (5) which audibly generates a tone, and in which at least one of the aforementioned switch structure (10, 10-2, 10-3) and electronic/electric component part installing structure is (10, 10-2, 10-3) provided in the operation panel section (1).

Thus, in the switch structure or electronic/electric component part installing structure provided in the operation panel section of the electronic musical instrument, the present invention can effectively prevent generation of vibrating sound (Rub & Buzz) between the intermediate member and the circuit board or panel member. In this way, the present invention can prevent generation of vibrating sound in the electronic musical instrument.

Note that numerical values and characters in parentheses above represent reference numerals of corresponding constituent elements in later-described embodiments.

The switch structure and electronic component part installing structure and the electronic musical instrument provided with the same can effectively prevent vibrating sound (Rub & Buzz) from being generated between the intermediate member and the circuit board or panel member due to vibration transmitted from the outside, with a simple construction having a minimized number of necessary component parts.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

Certain preferred embodiments of the present invention will hereinafter be described in detail, by way of example only, with reference to the accompanying drawings, in which.

DETAILED DESCRIPTION

[First Embodiment]

Figure 1A:
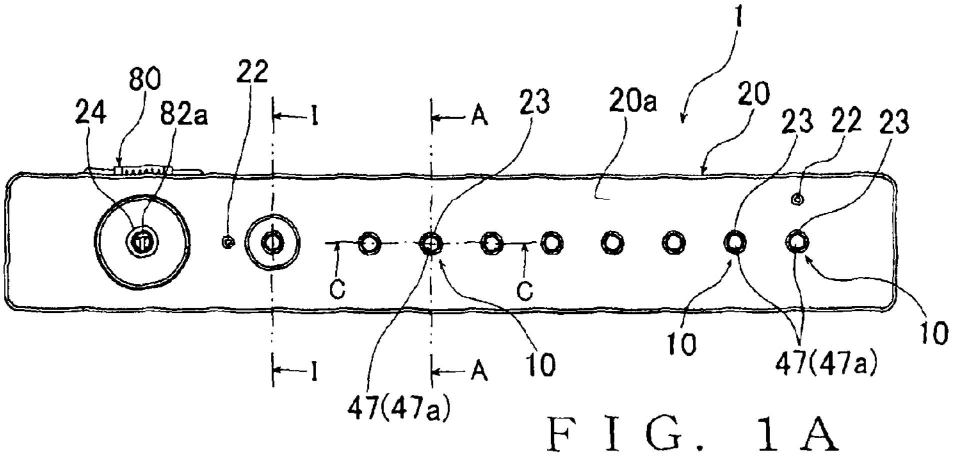
FIGS. 1A and 1B are a plan view and side view, respectively, of an operation panel section provided with a first embodiment of a switch structure of the present invention.
Figure 1B:
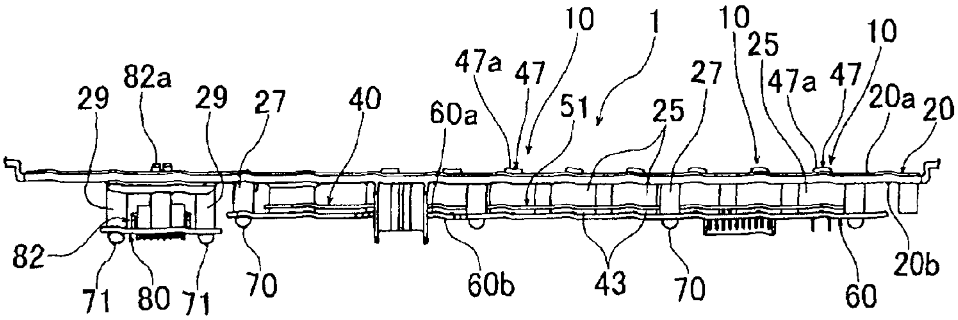
Figure 2:
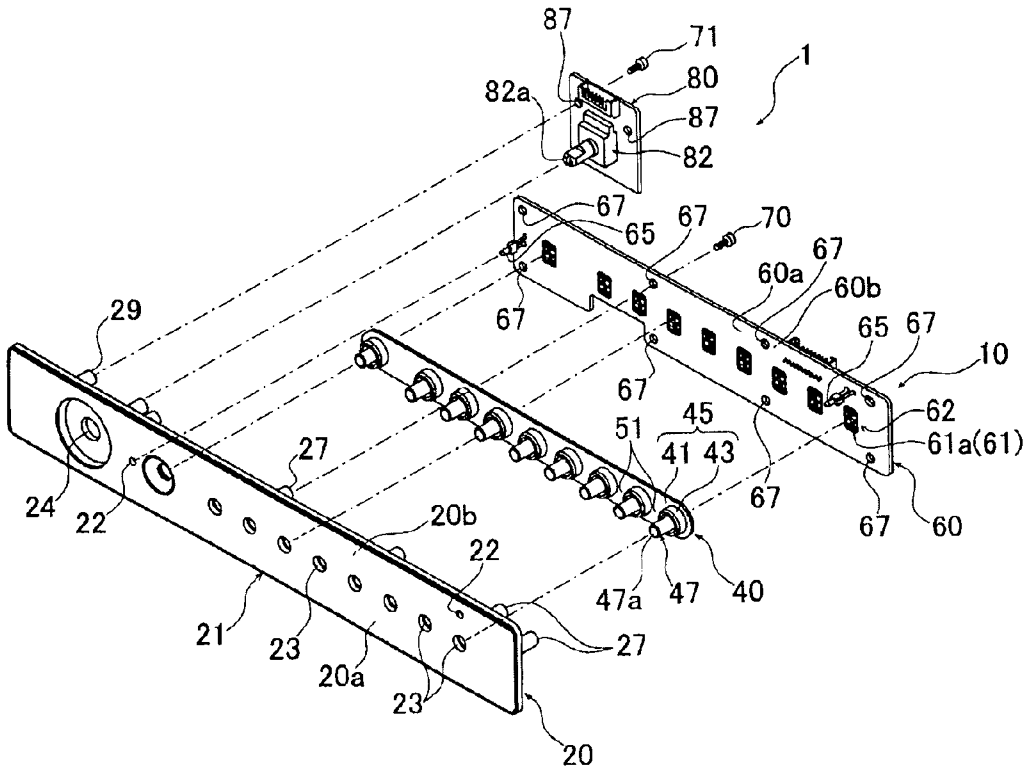
FIG. 2 is an exploded perspective view showing component parts of the operation panel section.
Figure 3:
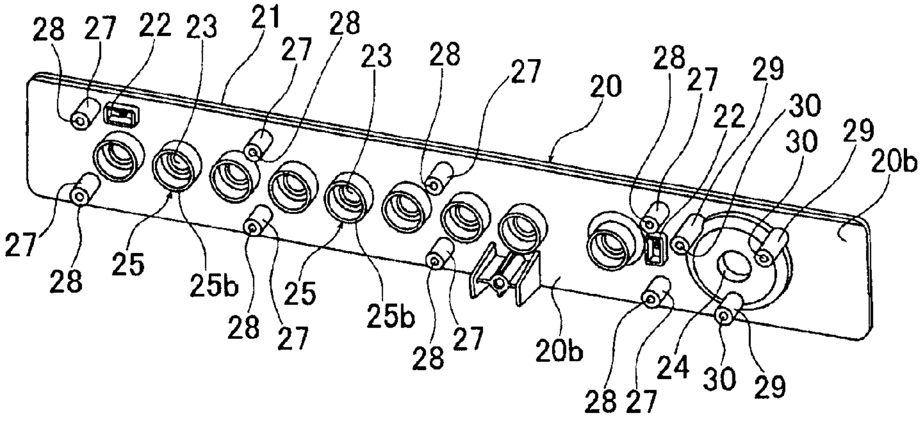
FIG. 3 is a perspective view of a panel member as viewed from the underside thereof.
Figure 4:
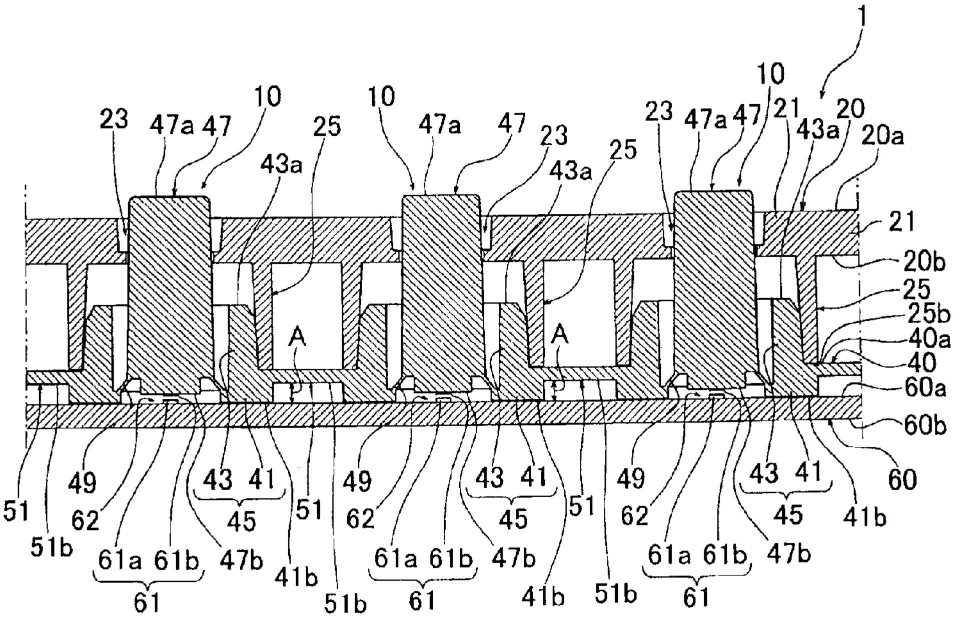
FIG. 4 is a side sectional view of the operation panel section taken along the C-C line of FIG. 1A.
Figure 5:
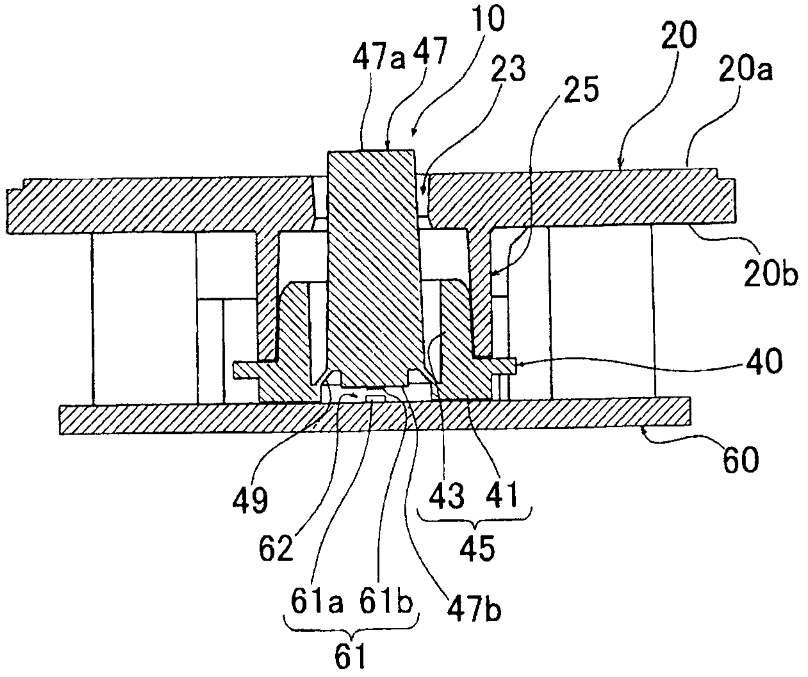
FIG. 5 is a sectional side view of the operation panel section taken along the A-A line of FIG. 1A.
Figure 6:
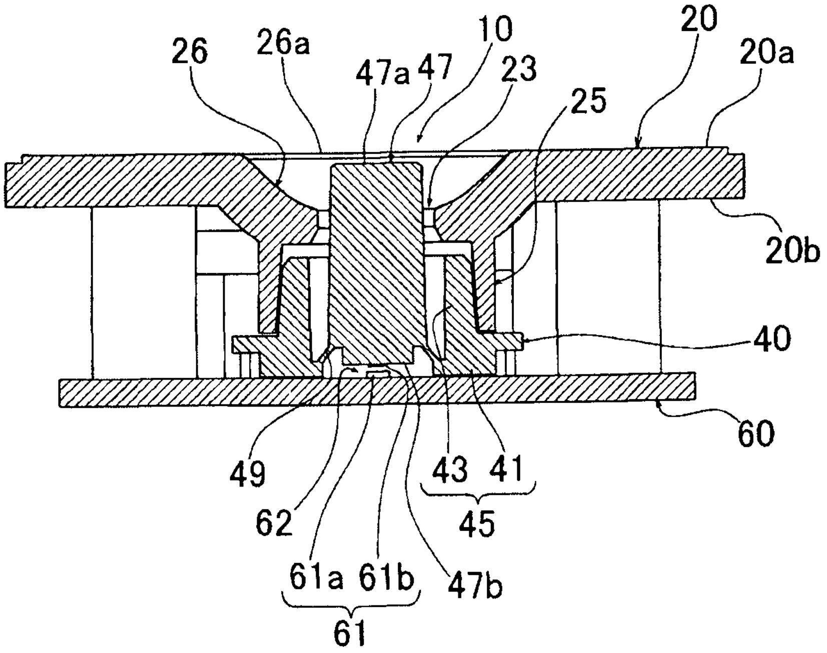
FIG. 6 is a sectional side view of the operation panel section taken along the I-I line of FIG. 1A.
Figure 7:
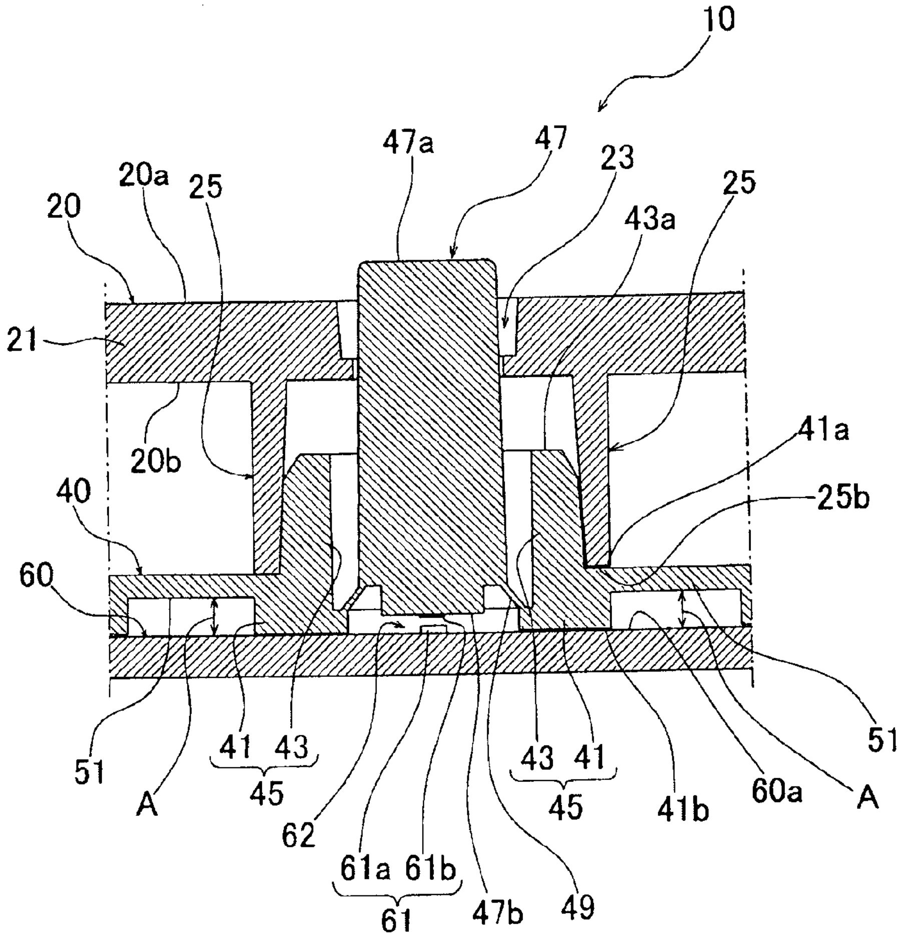
FIG. 7 is a sectional side view showing a detailed construction of the first embodiment switch structure.

FIGS. 1A and 1B are plan and side views, respectively, of an operation panel section 1 provided with a first embodiment of a switch structure (or electronic component part installing mechanism) 10 of the present invention. FIG. 2 is an exploded perspective view showing component parts of the operation panel section 1, and FIG. 3 is a perspective view of a panel member 20 as viewed from the underside 20*b* thereof. Further, FIGS. 4 to 6 are side sectional views of the switch structure 10, of which FIG. 4 is a sectional side view taken along the C-C line of FIG. 1A, FIG. 5 is a sectional side view taken along the A-A line of FIG. 1A and FIG. 6 is a sectional side view taken along the I-I line of FIG. 1A. Furthermore, FIG. 7 is a sectional side view showing a detailed construction of the switch structure 10, and FIG. 8 is an exploded perspective view showing a casing 2 and component parts around the casing 2 of a desktop-type electronic keyboard instrument 100 including the operation panel section 1 provided with the first embodiment of the switch structure 10.

Figure 8:
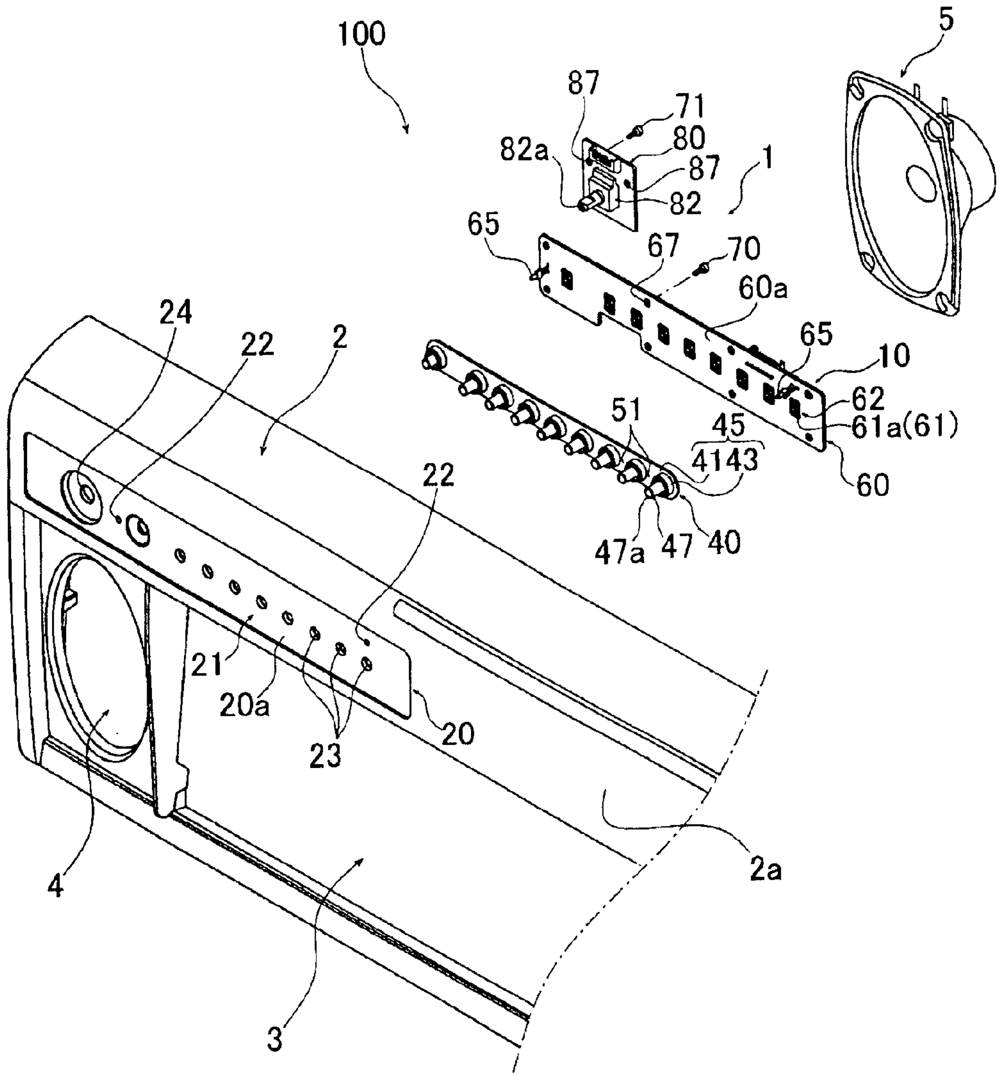
FIG. 8 is an exploded perspective view showing a casing and component parts around the casing of an electronic keyboard instrument provided with the switch structure.

As shown in FIG. 8, the first embodiment of the switch structure 10 is applied to the operation panel section 1 having various controls (or operators) of the electronic keyboard instrument 100 arranged thereon and operable by a user to perform various operation. The casing 2 shown in the figure is provided on and covers the upper surface side of a body section (not shown) of the electronic keyboard instrument 100, and a middle opening portion 3 of a generally rectangular shape for mounting therein a keyboard (not shown) is formed in a front central region of an upper wall 2*a* of the casing 2. A pair of side opening portions 4 each having a generally circular shape are formed on opposite sides of the middle opening portion 3 for mounting therein speakers 5. Note that only one of the side opening portions 4 is shown in the figure. The operation panel section 1 includes a panel member 20 of a flat plate shape constituted by a part of the upper wall 2*a* of the casing 2, and an intermediate member 40 and circuit board 60 adjacent to the lower surface 20*b* (FIG. 1) of the panel member 20. As shown in FIGS. 1 and 2, the first embodiment of the switch structure 10 is a structure which includes the panel member 20 and the intermediate member 40 disposed in superposed relation to each other with the intermediate member 40 sandwiched therebetween.

Note that the terms "upper", "lower", "upper surface", "lower surface", etc. are used herein to refer to directions as viewed when the panel member 20, intermediate member 40 and circuit board 60 are disposed in a horizontal orientation and in vertically superposed relation to one another, and these terms are defined regardless of actual installed or mounted positions of the operation panel section 1 and switch structure 10. Further, the operation panel section 1 is not necessarily installed with the panel member 20 oriented horizontally, it may sometimes be installed with the panel member 20 oriented vertically, depending on a form of its installation to electronic equipment, such as the electronic keyboard instrument 100.

As shown in FIG. 2, the circuit board 60 is a circuit board formed of a hard material in a substantially rectangular flat plate shape, and a plurality of switch sections (electronic component part installing sections) 62 having their respective fixed contacts 61*a* formed thereon are provided on the upper surface 60*a* of the circuit board 60 at predetermined intervals along a longitudinal direction of the upper surface 60*a*. Further, light emitting elements 65, such as LEDs, are mounted on predetermined positions of the upper surface 60*a* of the circuit board 60. It should be noted that, through a whole of the present disclosure, the term of "electronic component part" represents a broad technical concept including not only an element of electronic/electric circuits or devices but also a switch or switch element (namely, a contact). Also, the term of "electronic/electric component part" has the same meaning as the term of "electronic component part" as described above.

The intermediate member 40 is a one-piece member formed integrally of a resilient, flexible material, such as silicon, rubber or synthetic resin, and it has a thin overall shape elongated along the longitudinal direction of the circuit board 60. Further, as shown in FIG. 4, the intermediate member 40 includes: a base section 45 having fixing portions 41 each disposed around the outer periphery of one of the switch sections 62 on the upper surface 60*a* of the circuit board 60, and cylindrical held portions 43 each formed integrally with an upper end portion of a corresponding one of the fixing portions 41; operator portions 47 each provided for driving a corresponding one of the switch sections 62; and connection portions 49 each resiliently (movably) connecting a corresponding one of the operator portions 47 to the base section 45.

Each of the fixing portions 41 is provided with its lower surface 41*b* held in contact with the upper surface 60*a* of the circuit board 60 and surrounds a corresponding one of the switch sections 62. Each of the held portions 43 is formed integrally with the upper end of the corresponding fixing portion 41 and disposed around the corresponding switch section 62, and each of the held portions 43 is in the form of a cylindrical projection extending upwardly from the upper end of the corresponding fixing portion 41. Note that a boundary portion between the upper surface 41*a* of each of the fixing portion 41 and the corresponding held portion 43 (i.e., lower end corner region of the outer peripheral surface of the held portion 43) is formed as a portion against which is abutted the lower end 25*b* of a later-described holding portion 25 of the panel member 20.

Each of the operator portions (operators) 47 is in the form of a substantially circular cylinder with its axis extending vertically, and it projects upwardly in such a manner that its upper surface 47*a* is located above an upper end portion 43*a* of a corresponding one of the held portions 43. Further, the outer periphery of the lower surface 47*b* of each of the operator portions 47 is connected to the inner periphery of a corresponding one of the fixing portions 41 via the connection portion 49 of a thin plate shape. In this manner, each of the operator portions 47 is supported with its lower surface 47*b* located slightly above (spaced upwardly from) the lower surface 41*b* of the fixing portion 41. Further, a movable contact 61*b* constituting a switch contact (electronic component part) 61 is provided on the lower surface 41*b* of each of the operator portions 47.

A plurality of the switch structures 10, each comprising a set of the above-mentioned base section 45 (fixing portion 41 and held portion 43), operator portion 47 and connection portion 49, are provided at predetermined intervals along the longitudinal direction of the intermediate member 40. The fixing portions 41 of every two adjoining switch structures 10 are interconnected via a connecting portion 51. Each of the connecting portions 51 is a thin plate-shaped portion spanning between two adjoining fixing portions 41, and it is fixed to the fixing portions 41 with its lower surface 41*b* located slightly above (spaced upwardly from) the lower surfaces 41*b* of the fixing portions 41. Thus, with the fixing portions 41 mounted or installed on the upper surface 60*a* of the circuit board 60, as shown in FIGS. 4 and 7, a slight gap A is formed or defined between the lower surface 51*b* of each of the connecting portions 51 and the upper surface 60*a* of the circuit board 60.

As shown in FIGS. 1 to 3, the panel member 20 is a flat plat-shaped member having a horizontally-elongated overall shape. The panel member 20 includes a flat plate-shaped body portion 21, a plurality of opening portions 23 formed in the body portion 21, and cylindrical holding portions 25 each formed on the lower surface 20*b* along the outer periphery of a corresponding one of the opening portions 23 and projecting downward, i.e. toward the circuit board 60. Each of the opening portions 23 is in the form of a through-hole of a circular cross-sectional shape having a diameter slightly larger than the outer diameter of the operator portion 47, and, as shown in FIG. 4, the operator portion 47 is passed through the opening portion 23 in such a manner that its upper surface 47*a* is exposed on the upper surface 20*a* of the panel member 20. Namely, the opening portions 23 are formed in positions corresponding to the operator portions 47 of the intermediate member 40, and each of the holding portions 25 is a cylindrical projection provided around a corresponding one of the opening portions 23 and has an inner diameter substantially equal to the outer diameter of a corresponding one of the held portions 43 in such a manner that the held portions 43 of the intermediate member 40 can be fitted inside, i.e. fittedly held in, the holding portion 25. Further, the holding portion 25 is sized such that, with the panel member 20 and the circuit board 60 fixed together by means of later-described screws (fixing means) 70, its lower end 25*b* is pressed against the upper surface 41*a* of the fixing portion 41 of the intermediate member 40. Note that, for convenience of die molding, various projecting component parts, such as the aforementioned holding portion 25, held portion 43 and operator portion 47, are shaped to taper from their proximal end toward their distal end. With such tapering shapes, fitting engagement between the holding portion 25 and the held portion 43 etc. can be effected smoothly.

Further, as shown in FIGS. 2 and 3, mounting bosses 27 each in the form of a projection of a circular columnar shape are formed on the lower surface 20*b* of the panel member 20 at predetermined positions near the outer periphery of the lower surface 20*b*. Further, a screw hole 28 for screwing engagement with the screw 70 is formed in a distal end portion of each of the bosses 27, and screw holes 67 each for passage therethrough of a screw are formed in the circuit board 60 at a plurality of positions near the outer periphery of the circuit board 60. Further, the bosses 27 of the panel member 20 and the screw holes 67 of the circuit board 60 are formed in mutually-corresponding positions. The screws (fixing means) 70 are provided for fastening or fixing together the panel member 20 and the circuit board 60 in face-to-face pressed engagement. The screws 70 are each passed through the screw hole 67 from the side of the lower surface 60*b* of the circuit board 60 and fixedly screwed into the hole 28 of the boss 27.

Furthermore, small holes 22 are formed in the body portion 21 of the panel member 20 at positions corresponding to the light emitting elements 65 in such a manner that the light emitting elements 65 are exposed out of the small holes 22. Furthermore, another circuit board 80 is provided adjacent to the lower surface 20*b* of the panel member 20, and an electronic component part 82 that is a rotary variable resistor is mounted on the circuit board 80. A through-hole 24 for passage therethrough of a rotation shaft 82*a* of the electronic component 82 is formed in the body portion 21 of the panel member 20 at a position corresponding to the electronic component 82. In addition, as a structure for fixing the circuit board 80 to the lower surface 20*b* of the panel member 20, the operation panel 1 further includes a boss 29 provided on the lower surface 20*b* and having a screw hole 30 formed in the boss 29, and a screw hole 87 formed through the circuit board 80 for passage therethrough of a screw, and a screw 71 screwed into the screw hole 30.

As shown in FIGS. 1B and 8, the upper surface 20*a* of the panel member 20 is located slightly lower than the upper surface of the upper wall 2*a*. Although not particularly shown, a sheet member of a thin plate shape can be mounted over the upper surface 20*a* of the panel member 20. In such a case, openings are formed in the sheet member at positions which correspond to the opening portions 23 through which the upper surfaces 47*a* of the operator portion 47 project.

According to the instant embodiment of the switch structure 10, where the panel member 20 and the circuit board 60 are fixed together in face-to-face pressed engagement with each other with the intermediate member 40 sandwiched therebetween, each of the operator portions 47 of the intermediate member 40 is inserted in a corresponding one of the opening portions 23 of the panel member 20 in such a manner that the upper surface 47*a* of the operator portion 47 is exposed out of the opening portion 23 toward the upper surface 20*a* of the panel member 20. Further, the held portion 43 of the intermediate member 40 is fittedly held inside the holding portion 25 of the panel member 20. Further, the upper surface 41*a* of the fixing portion 41 of the intermediate member 40, more particularly the boundary portion between the upper surface 41*a* of the fixing portion 41 and the held portion 43, is sandwiched between the lower end 25*b* of the holding portion 25 of the panel member 20 and the upper surface 60*a* of the circuit board 60. Further, in this state, the connecting portion 51 interconnecting the adjoining fixing portions 41 is disposed with the gap A defined between the connecting portion 51 and the upper surface 60*a* of the circuit board 60.

Furthermore, the instant embodiment of the switch structure 10 includes, as component parts of the switch contact 61, the fixed contact 61*a* provided on the switch section 62 of the circuit board 60 and the movable contact 61*b* provided on the lower surface 47*b* of the operator portion 47. As the upper surface 47*a* of the operator portion 47 exposed toward the upper surface 20*a* of the panel member 20 is depressed, for example, by a finger of the user, the operator portion 47 moves downward or descends while warping the connection portion 49 of the intermediate member 40, so that switching is effected by the movable contact 61*b* of the operator portion 47 being brought into contact with the fixed contact 61*a* of the switch section 62. Once user's force depressing the operator portion 47 is removed, the operator portion 47 moves upward or ascends back to its original position by the resilience of the connection portion 49, so that the contact between the fixed contact 61*a* and the movable contact 61*b* is terminated.

As set forth above, the instant embodiment of the switch structure 10 is a structure which includes: the circuit board 60 including the switch section 62 having the fixed contact 61*a* of the switch contact 61; the resilient intermediate member 41; and the flat plate-shaped panel member 20, and in which the panel member 20 and the circuit board 60 are fixed together by means of the screws 70 in face-to-face pressed engagement with the intermediate member 40 sandwiched between the panel member 20 and the circuit board 60. The intermediate member 40 includes: the base section 45 having the fixing portion 41 disposed around the outer periphery of the switch section 62 of the circuit board 60, and the cylindrical held portion 43 formed integrally with the upper end of the fixing portion 41; the operator portion 47 for driving the switch section 62; and the connection portion 49 resiliently connecting the operator portion 47 to the base section 45. Further, the panel member 20 includes: the flat plate-shaped body portion 21; the opening portion 23 formed in the body portion 21 for positioning therein the operator portion 47; and the cylindrical holding portion 25 formed on the lower surface 20*b* of the body portion 21 around the outer periphery of the opening portion 23 formed in the lower surface 21*b* of the body portion 21. Furthermore, the upper surface 47*a* of the operator portion 47 of the intermediate member 40 is exposed out of the opening portion 23 of the panel member 20, and the fixing portion 41 of the intermediate member 40 is sandwiched between the lower end 25*b* of the holding portion 25 of the panel member 20 and the upper surface 60*a* of the circuit board 60.

Because the fixing portion 41 of the intermediate member 40 is sandwiched between the lower end 25*b* of the holding portion 25 of the panel member 20 and the upper surface 60*a* of the circuit board 60 as noted above, the intermediate member 40 can be reliably fixed relative to the panel member 20 and circuit board 60. Further, the intermediate member 40 can be even more reliably fixed relative to the panel member 20 and circuit board 60 because the held portion 43 of the intermediate member 40 is fittedly held in the holding portion 25 of the panel member 20. With such arrangements, the instant embodiment can effectively suppress vibrating sound (Rub & Buzz) between the intermediate member 40 and the panel member 20 and circuit board 60 even in a situation where vibration resulting from tones audibly generated through the speakers 5 transmits to the panel member 20 or circuit board 60.

Further, with the held portion 43 fittedly held by the holding portion 25 of the panel member 20, the operator portion 47 inserted in the opening portion 23 of the panel member 20 can be positioned appropriately, Thus, the instant embodiment can achieve an enhanced design of the operation panel section 1. Further, because the intermediate member 40 includes the operator portion 47 having both a function as a control (operator) for being depressed by the user and a function as a driver for driving the switch section 62, the instant embodiment can reduce the number of necessary component parts and simplify necessary steps for assembling the switch structure. Further, with the fixing portion 41 of the intermediate member 40 sandwiched between the lower end 25*b* of the holding portion of the panel member 20 and the upper surface of the circuit board 60, there is no need for any separate means for fixing the intermediate member 40 to the circuit board 60. In this way, it is possible to not only simplify the shape of the intermediate member 40 but also facilitate assembling of the switch structure 10.

Further, the circuit board 60 provided in the operation panel section 1 includes a plurality of the switch sections 62 disposed at predetermined intervals, the intermediate member 40 includes a plurality of the operator portions 47 corresponding to the switch sections 62, and the panel member 20 includes a plurality of the opening portions 23 corresponding to the operator portions 47. Namely, a plurality of the switch structures 10 are provided in the single operation section 1. Further, the intermediate member 40 includes the connecting portions 51 interconnecting the fixing portions 41 of every two adjoining switch structures 1, and each of the connecting portions 51 is disposed to define the gap A between the connecting portion 51 and the upper surface 60*a* of the circuit board 60.

Because the connecting portion 51 interconnecting the fixing portions 41 provided on the switch sections 62 is disposed in such a manner as to not contact the circuit board 60 (i.e., out of contact with the circuit board 60), it is possible to prevent generation of vibrating sound (so-called Rub & Buzz) between the connecting portion 51 and the circuit board 60. In this way, it is possible to effectively prevent generation of vibrating sound between the switch structures that has been a problem with the conventionally-known counterparts. Further, according to the instant embodiment of the switch structure, the connecting portion 51 is disposed spaced from the upper surface 60*a* of the circuit board 60. Thus, in assembling the operation panel section 1 including a plurality of the switch structures 10, it is possible to assemble the intermediate member 40 with an increased ease. As a result, the operation panel section 1 can be assembled with an increased efficiency.

The construction for exposing the upper surface 47*a* of the control portion 47 out of the opening portion 23 toward the upper surface 20*a* of the panel member 20 is not necessarily limited to the one shown FIG. 5 where the upper surface 47*a* of the control portion 47 is projected upwardly beyond the upper surface 20*a*, and may be one where an upwardly-flaring recess portion 26 of an inverted truncated cone shape is formed around the opening portion 23 in the upper surface 20*a* of the panel member 20 in such a manner that the upper surface 47*a* is located within the recess portion 26 as shown in FIG. 6. Further, in this case, a flexible, thin plate-shaped sheet member 26*a* may be placed on the opening end of the recess portion 26 in such a manner that the upper surface 47 47*a* of the operator portion 47 can be depressed by the user through the sheet member 26*a*.

[Second Embodiment]

The following describe a second embodiment of the switch structure 10-2 of the present invention. In the following description about the second embodiment, identical or similar elements to those in the first embodiment are indicated by the same reference numerals as used for the first embodiment and will not be described here to avoid unnecessary duplication. Also note that features other than those explained below in relation to the second and subsequent embodiments are generally the same as in the first embodiment.

Figure 9:
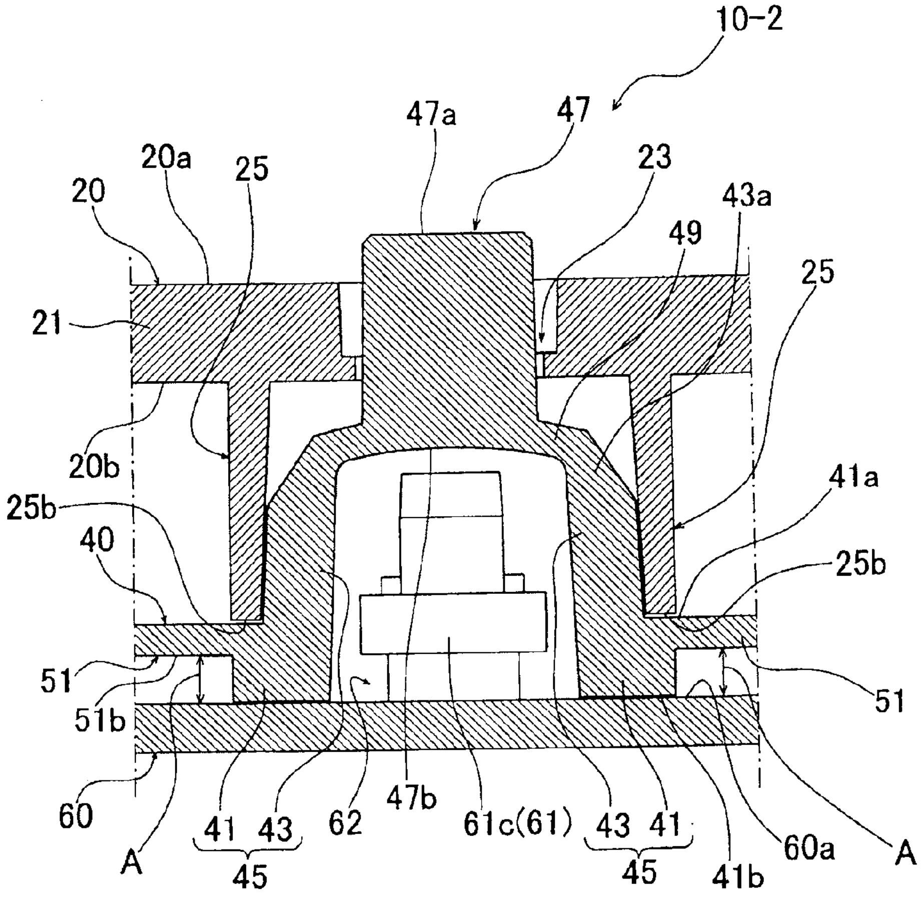
FIG. 9 is a sectional side view showing a detailed construction of a second embodiment of the switch structure.

FIG. 9 is a sectional side view showing a detailed construction of the second embodiment of the switch structure 10-2. In the above-described first embodiment of the switch structure 10, the connection portion 49, interconnecting the operator portion 47 and the fixing portion 41 in the intermediate member 40, connects between the outer periphery of the lower surface 47*b* of the operator portion 47 and the inner periphery of the fixing portion 41. By contrast, in the second embodiment of the switch structure 10-2, the connection portion 49 is provided between the outer periphery of the lower surface 47*b* of the operator portion 47 and the upper end portion 43*a* of the held portions 43. Thus, the lower surface 47*b* of the operator portion 47 in the second embodiment is located at a higher position than that in the first embodiment, and a greater space than in the first embodiment is defined between the lower surface 47*b* of the operator portion 47 and the upper surface 60*a* (switch section 62).

Further, the second embodiment of the switch structure 10-2 includes, as a component part constituting the switch contact 61, a push button switch 61*c* provided in the switch section 62 of the circuit board 60 in place of the combination of the fixed and movable contacts 61*a* and 61*b* provided in the first embodiment of the switch structure 10. The push button switch 61*c* is turned on by being depressed and turned off by the depressing force being removed therefrom. Thus, as the upper surface 47*a* of the operator portion 47, exposed out of the opening portion 23 of the panel member 20, is depressed by a finger or the like of the user, the operator portion 47 descends while causing warping of the connection portion 49 of the intermediate member 40, so that the push button switch 61*c* is depressed by the lower surface 47*b* of the operator portion 47 to thereby turn on the switch. Once the force depressing the operator portion 47 is removed, the operator portion 47 ascends by the resilience of the connection portion 49 to automatically return to the original position, so that the depression of the push button switch 61*c* is terminated and thus the switch is turned off.

[Third Embodiment]

Figure 10:
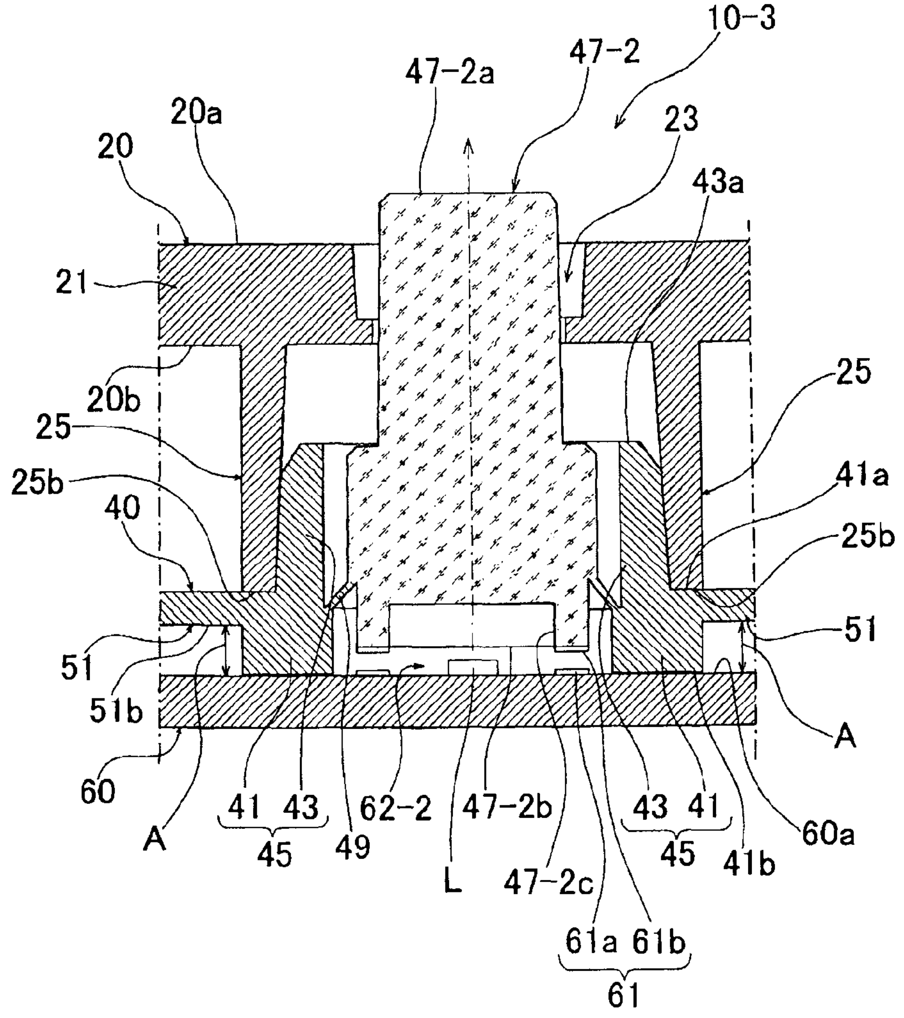
FIG. 10 is a sectional side view showing a detailed construction of a third embodiment of the switch structure.

The following describe a third embodiment of the switch structure 10-3 of the present invention. FIG. 10 is a sectional side view showing a detailed construction of the third embodiment of the switch structure 10-3. The third embodiment of the switch structure 10-3 includes a light emitting element (electronic component part) L having a light emitting function in addition to the switch contact 61 (fixed contact 61*a* and movable contact 61*b*) described above in relation to the first embodiment, and it includes a operator portion 47-2 having transparency (hereinafter referred to as "transparent portion 47-2") in place of the operator portion 47 of the intermediate member 40. Namely, in the third embodiment of the switch structure 10-3, at least a part of the transparent portion 47-2 connected to the base section 45 via the connection portion 49 is transparent or semitransparent by being formed of a transparent or semitransparent material.

A circular recess portion 47-2*c* is formed centrally in the lower surface 47-2*b* of the transparent portion 47-2, and the movable contact 61*b* formed of carbon or the like is provided on the lower end surface of a ring-shaped projection formed around the transparent portion 47-2. Further, the fixed contact 61*a* is formed on the circuit board 60 at a position opposed to the movable contact 61*b*. Further, a light emitting portion (electronic component part installing portion) 62-2 having the light emitting element L mounted therein is provided on the upper surface 60*a* of the circuit board 60 under a central underside region of the transparent portion 47-2. The light emitting element L is a light emitting diode in the form of a chip integrally formed on the circuit board 60. Thus, emitted light of the light emitting element L is transmitted through the transparent portion 47-2 from the lower surface 47-2*b* to the upper surface 47-2*a*. The light emitting element L is disposed within the circular recess portion 47-2*c* formed in the lower surface of the transparent portion 47-2.

According to the third embodiment 10-3, where the intermediate member 40 includes the transparent portion 47-2 and the light emitting element L is provided in the light emitting portion 62-2 of the circuit board 60, the emitted light of the light emitting element L can be radiated to the upper surface 20*a* of the panel member 20. Thus, the operation panel section 1 can have and perform a light emitting function, with a simple construction. Further, in the third embodiment 10-3, where the panel member 20 and the circuit board 60 are fixed together by means of the screws 70 in face-to-face pressed engagement with each other and where the held portion 43 is held inserted in the holding portion 25 of the panel member 20, the intermediate member 40 and the transparent portion 47-2 are positioned relative to the panel member 20 and circuit board 60 with a high accuracy. Thus, even in the instant embodiment where the emitted light from the light emitting element L provided on the circuit board 60 is transmitted through the transparent portion 47-2, it is possible to prevent the light axis of the emitted light of the light emitting element L from being deviated relative to the transparent portion 47-2.

Whereas the third embodiment 10-3 has been described above in relation to the case where the fixed contact 61*a* of the switch contact 61 and the light emitting element L are provided in the light emitting portion 62-2 over the circuit board 60, the present invention is not so limited. For example, only the light emitting element L may be provided in the light emitting portion 62-2 with the fixed and movable contacts 61*a* and 61*b* of the switch contact 61 dispensed with, although not particularly shown. In this way, an electronic component installing structure equipped with only the light emitting function can be realized with a simple construction. Particularly, in a case where a component part equipped with only a light emitting function is added to the operation panel section including various types of switch structures and a switch structure equipped with only the light emitting function, the switch structures and the component part equipped with only the light emitting function can be constructed in a similar manner, it is possible to simplify the construction of the operation panel section.

The entire transparent portion 47-2, rather than only a part of the transparent portion 47-2, may be made transparent or semitransparent. In this case, it is desirable that only the transparent portion 47-2 be made transparent or semitransparent and the base section 45 be made opaque with the connection portion 49 as a boundary between the transparent or semitransparent portion and the opaque portion, in order to prevent the light of the light emitting element L from undesirably leaking toward adjoining other switch structures 10 (10-2). As a specific method for manufacturing or making the intermediate member 40 for example by injection molding, two materials of different colors may be injected respectively into a mold for forming the base section 45 and a mold for forming the transparent portion 47-2 in such a manner that the connection portion 49 becomes a boundary between the two materials. Alternatively, only the base section 45 of the intermediate member 40 molded in advance may be colored.

Note that, in the case where only the light emitting element L is provided in the light emitting portion 62-2 over the circuit board 60, the intermediate member 40 (particularly, the connection portion 49) may be formed of a hard material that does not have resiliency or flexibility, because the transparent portion 47-2 need not move resiliently in the vertically direction.

[Fourth Embodiment]

Figure 11:
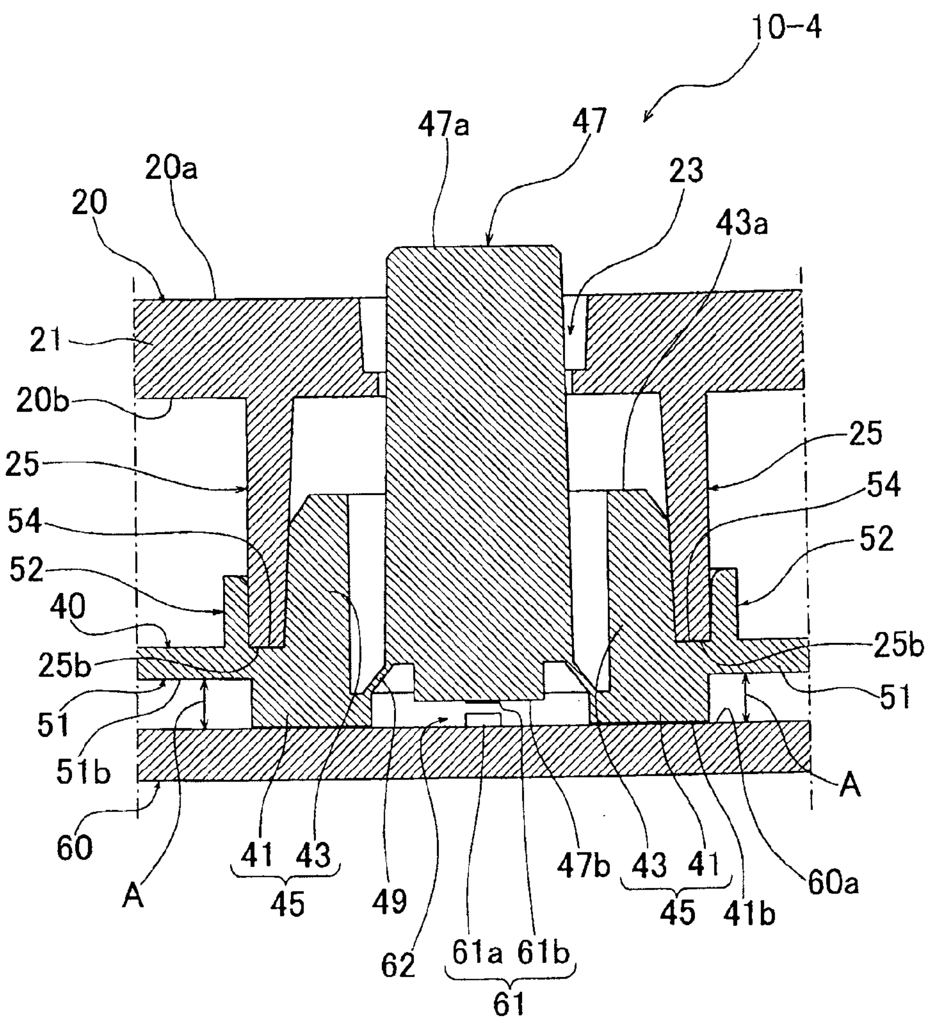
FIG. 11 is a sectional side view showing a detailed construction of a fourth embodiment of the switch structure.

The following describe a fourth embodiment of the switch structure 10-4 of the present invention. FIG. 11 is a sectional side view showing a detailed construction of the fourth embodiment of the switch structure 10-4. In the fourth embodiment of the switch structure 10-4, a surrounding portion 52 in the form of a cylindrical projection surrounding the outer periphery of the holding portion 25 of the panel member 20 is formed on the intermediate member 40 around the outer periphery of the held portion 43, and a recess portion 54 for insertion therein of the lower end 25*b* of the holding portion 25 is provided between the held portion 43 and the surrounding portion 52. Thus, the lower end 25*b* of the holding portion 25 is fitted in the recess portion 54, with the held portion 43 held fitted on the holding portion 25, so that the surrounding portion 52 overlaps the outer periphery of the holding portion 25.

With such arrangements, the surrounding portion 52 can seal up between the lower end 25*b* of the holding portion 25 and the fixing portion 41. Thus, even when liquid has passed through the opening portion 23 toward the circuit board 60, it is possible to prevent the liquid from entering the switch portion 62 of the circuit board 60. In this way, the fourth embodiment of the switch structure 10-4 can have and perform a waterproof function. Also, the fourth embodiment 10-4 can prevent foreign substances, such as dust, from entering the switch portion 62 from the upper surface side of the panel member 20.

Whereas the fourth embodiment of the switch structure 10-4 has been described above in relation to the case where the surrounding portion 52 and the recess portion 54 are employed in the construction of the first embodiment of the switch structure 10, such surrounding portion 52 and recess portion 54 may be provided in the construction of the second embodiment of the switch structure 10-2 and/or third embodiment of the switch structure 10-3, although not particularly shown.

Figure 12:
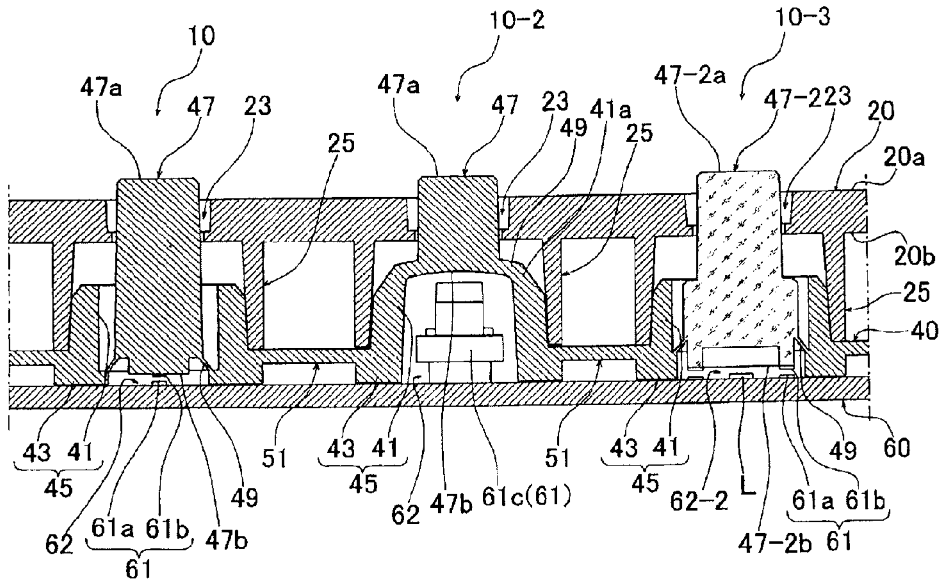
FIG. 12 is a sectional side view showing an operation panel section employing a combination of the first to third embodiments of the switch structure of the present invention.

FIG. 12 is a sectional side view showing an operation panel section 1 including a combination of the first, second and third embodiments of the switch structure 10, 10-2 and 10-3. Namely, as shown in FIG. 12, the first embodiment of the switch structure 10 including the fixed and movable contacts 61*a* and 61*b*, the second embodiment of the switch structure 10-2 including the push button switch 61*c* and the third embodiment of the switch structure 10-3 including the light emitting element L and transparent portion 47-2 may be provided in a mixture as the plurality of switch structures in the same operation panel section 1. In this way, different types of switch structures can be provided in the single operation panel section 1 including various component parts common to the different types of switch structures. The first, second and third embodiments of the switch structure 10, 10-2 and 10-3 may be combined in any desired manner. Further, the total number of the first, second and third embodiments of the switch structure 10, 10-2 and 10-3 to be provided in the single operation panel section 1 may be chosen as desired, and the respective numbers of the first, second and third embodiments of the switch structure 10, 10-2 and 10-3 to be provided may be chosen as desired.

Note that, in the fourth embodiment of the switch structure 10-4 including the surrounding portion 52 and recess portion 54, the entire operation panel section 1 has to have and perform a waterproof function. Thus, normally, it is desirable to employ a construction where the surrounding portion 52 and recess portion 54 are provided for each of the switch structures in the same operation panel section 1.

Whereas various embodiments of the present invention have been described above, the present invention should not be construed as limited to the described embodiments and may be modified variously within the scope of the technical ideas set forth in the appended claims and the specification and drawings. For example, whereas the various embodiments of the present invention have been described above in relation to the case where the entire intermediate member 40 is formed of rubber or synthetic resin having resiliency or flexibility, it is only necessary that at least the connection portion of the intermediate member 40 be formed of rubber or synthetic resin having resiliency or flexibility, in which case the other portions of the intermediate member 40 may be formed of a hard material having substantially no resiliency or flexibility.

This application is based on, and claims priority to, JP PA 2010-278688 filed on 14 Dec. 2010. The disclosure of the priority applications, in its entirety, including the drawings, claims, and the specification thereof, are incorporated herein by reference.

What is claimed is:

1. A switch structure comprising:

a circuit board including a switch section wherein the switch section includes a switch contact;

an intermediate member including: a base section provided in a corresponding relation to the switch section on said circuit board and including a held portion; a operator portion operable to drive said switch section; and a resilient connection portion resiliently connecting the operator portion to said base section;

a panel member including a plate-shaped body portion, an opening portion formed in the body portion for positioning therein the operator portion, and a holding portion provided on a lower surface of the body portion around the opening portion and projectinq toward said circuit board; and a fixing member which fixes together said panel member and said circuit board in face-to-face pressed engagement with said intermediate member sandwiched between said panel member and said circuit board, wherein the operator portion of the intermediate member is partly exposed out of the opening portion of the panel member, the held portion of said intermediate member is held fitted with the holding portion of said panel member, wherein the base section further includes a fixed portion at a lower end of the held portion so that the held portion is formed integrally with an upper end of the fixing portion, the fixed portion having a lateral size larger than the held portion to form a step at the upper end of the fixing portion, and wherein the step of the fixing portion is sandwiched between a lower end of the holding portion of said panel member and an upper surface of said circuit board.

2. The switch structure as claimed in claim 1, wherein the held portion of the base section of the intermediate member has a cylindrical outer shape, and the fixed portion has a diameter larger than the held portion to form a circular step at the upper end of the fixing portion as said step.

3. The switch structure as claimed in claim 1, wherein the base section is provided in a positional corresponding relation to an outer periphery of the switch section on said circuit board.

4. The switch structure as claimed in claim 1, wherein the switch contact includes a fixed contact provided in the switch section of said circuit board and a movable contact provided on a lower surface of the operator portion, and wherein, in response to depressing operation on the operator portion, switching is effected by the movable contact being brought into contact with the fixed contact.

5. The switch structure as claimed in claim 1, wherein the switch contact includes a push button switch provided in the switch section and activatable by being pressed, and wherein, in response to depressing operation on the operator portion, switching is effected by a lower surface of the operator portion depressing the push button switch.

6. The switch structure as claimed in claim 1, wherein at least a part of said operator portion is formed as a transparent portion that is transparent or semitransparent, and which further includes a light emitting element provided on said circuit board in the switch section in such a manner that emitted light of the light emitting element passes through the transparent portion so as to be radiated to an upper surface of the operator portion.

7. A switch structure comprising:

a circuit board including a switch section wherein the switch section includes a switch contact;

an intermediate member including: a base section provided in a corresponding relation to the switch section on said circuit board and including a held portion; a operator portion operable to drive said switch section; and a resilient connection portion resiliently connecting the operator portion to said base section;

a panel member including a plate-shaped body portion, an opening portion formed in the body portion for positioning therein the operator portion, and a holding portion provided on a lower surface of the body portion around the opening portion and projecting toward said circuit board; and a fixing member which fixes together said panel member and said circuit board in face-to-face pressed engagement with said intermediate member sandwiched between said panel member and said circuit board, wherein the operator portion of the intermediate member is partly exposed out of the opening portion of the panel member, the held portion of said intermediate member is held fitted with the holding portion of said panel member, wherein said circuit board includes a plurality of the switch sections disposed at a predetermined interval, said intermediate member including a plurality of the base sections and a plurality of the operator portions corresponding to individual ones of the plurality of the switch sections, said panel member having a plurality of the opening portions corresponding to individual ones of the plurality of the operator portions, and wherein said intermediate member further includes a connecting portion interconnecting the base sections disposed along respective outer peripheries of adjoining ones of the operator portions, the connecting portion being formed in such a manner that a gap is defined between the connecting portion and the upper surface of said circuit board.

8. A switch structure comprising:

a circuit board including a switch section wherein the switch section includes a switch contact;

an intermediate member including: a base section provided in a corresponding relation to the switch section on said circuit board and including a held portion; a operator portion operable to drive said switch section; and a resilient connection portion resiliently connecting the operator portion to said base section;

a panel member including a plate-shaped body portion, an opening portion formed in the body portion for positioning therein the operator portion, and a holding portion provided on a lower surface of the body portion around the opening portion and proiectinq toward said circuit board; and a fixing member which fixes together said panel member and said circuit board in face-to-face pressed engagement with said intermediate member sandwiched between said panel member and said circuit board, wherein the operator portion of the intermediate member is partly exposed out of the opening portion of the panel member, the held portion of said intermediate member is held fitted with the holding portion of said panel member, wherein said intermediate member includes a surrounding portion in a form of a cylindrical projection provided along an outer periphery of the held portion and surrounding an outer periphery of the holding portion of said panel member, and a recess portion provided between the held portion and the surrounding portion for insertion therein of a lower end of the holding portion, and wherein the lower end of the holding portion is disposed in the recess portion, with the held portion held fitted with the holding portion, so that the surrounding portion overlaps the outer periphery of the holding portion.

9. An electronic/electric component part installing structure comprising:

a circuit board including a plurality of electronic component part installing sections in each of which an electronic/electric component part is provided;

an intermediate member including: a plurality of base sections each provided in a corresponding relation to any one of the electronic component part installing sections on said circuit board, each of the base sections including a held portion; a plurality of operator portions each provided over a corresponding one of the electronic component part installing sections; and a plurality of connection portions each connecting a corresponding one of the operator portions to a corresponding one of the base sections;

a panel member including a plate-shaped body portion, a plurality of opening portions each formed in the body portion in a corresponding relation to any one of the operator portions for positioning therein the corresponding operator portion, and a plurality of holding portions each provided on a lower surface of the body portion around a corresponding one of the opening portions and projecting toward said circuit board; and a fixing member which fixes together said panel member and said circuit board in face-to-face pressed engagement with said intermediate member sandwiched between said panel member and said circuit board, wherein each of the operator portions of said intermediate member is partly exposed out of the corresponding opening portion, and the held portion of each of the base sections of said intermediate member is held fitted with the corresponding holding portion of said panel member, and wherein said intermediate member further includes one or more connecting portions each interconnecting a corresponding one of the base sections and another base section adjoining the corresponding base section, each of the connecting portions being provided in such a manner that a gap is defined between the connecting portion and an upper surface of said circuit board.

10. The electronic/electric component part installing structure as claimed in claim 9, wherein each of the base sections further includes a fixed portion at a lower end of the held portion so that the held portion is formed integrally with an upper end of the fixing portion, the fixed portion having a lateral size larger than the held portion to form a step at the upper end of the fixing portion, and wherein the step of the fixing portion is sandwiched between a lower end of the corresponding holding portion of said panel member (20) and the upper surface of said circuit board.

11. The electronic/electric component part installing structure as claimed in claim 10, wherein the held portion of each of the base sections of the intermediate member has a cylindrical outer shape, and the fixed portion has a diameter larger than the held portion to form a circular step at the upper end of the fixing portion as said step.

12. The electronic/electric component part installing structure as claimed in claim 9, wherein each of the base sections is provided in a positional corresponding relation to an outer periphery of the corresponding electronic component part installing section on said circuit board.

13. The electronic/electric component part installing structure as claimed in claim 9, wherein the electronic component part includes a switch, and the connection portion comprises a resilient connection portion resiliently connecting the corresponding operator portion to the corresponding base section to allow the connection portion to move for activating the switch.

14. The electronic/electric component part installing structure as claimed in claim 9, wherein the fixing member comprises:

a plurality of bosses provided on the lower surface of the body portion of the panel member and projecting toward the upper surface of the circuit board, a number of the bosses being less than a number of the operator portions;

a plurality of screw holes each formed in a distal end portion of any one of the bosses; and a plurality of screws each adapted to be screwed into any one of the screw holes of the bosses, and wherein the screws are screwed into the screw holes of the bosses from a lower surface of circuit board to fix together said panel member and said circuit board in face-to-face pressed engagement with said intermediate member sandwiched between said panel member and said circuit board.

15. An electronic musical instrument comprising:

an operation panel section where are arranged controls operable to perform setting operation of various functions;

a speaker which audibly generates a tone; and an electronic/electric component part installing structure, wherein the electronic/electric component part installing structure includes:

a circuit board including a plurality of electronic component part installing sections in each of which an electronic/electric component part is provided;

an intermediate member including: a plurality of base sections each provided in a corresponding relation to any one of the electronic component part installing sections on said circuit board, each of the base sections including a held portion; a plurality of operator portions each provided over a corresponding one of the electronic component part installing sections; and a plurality of connection portions each connecting a corresponding one of the operator portions to a corresponding one of the base sections;

a panel member including a plate-shaped body portion, a plurality of opening portions each formed in the body portion in a corresponding relation to any one of the operator portions for positioning therein the corresponding operator portion, and a plurality of holding portions each provided on a lower surface of the body portion around a corresponding one of the opening portions and projectinq toward said circuit board; and a fixing member which fixes together said panel member and said circuit board in face-to-face pressed engagement with said intermediate member sandwiched between said panel member and said circuit board, wherein each of the operator portions of said intermediate member is partly exposed out of the corresponding opening portion, and the held portion of each of the base sections of said intermediate member is held fitted with the corresponding holding portion of said panel member, and wherein said intermediate member further includes one or more connecting portions each interconnecting a corresponding one of the base sections and another base section adjoining the corresponding base section, each of the connecting portions being provided in such a manner that a gap is defined between the connecting portion and an upper surface of said circuit board.

* * * * *